United States Patent [19]

Araki

[11] Patent Number: 5,785,096

[45] Date of Patent: Jul. 28, 1998

[54] WIRE RETAINER

[75] Inventor: Yoshihiro Araki, Yokkaichi, Japan

[73] Assignee: Sumitomo Wiring Systems, Ltd., Japan

[21] Appl. No.: 739,554

[22] Filed: Oct. 30, 1996

[30] Foreign Application Priority Data

Nov. 14, 1995 [JP] Japan ................................. 7-295385

[51] Int. Cl.⁶ ............................................. B21F 33/00
[52] U.S. Cl. ................... 140/92.1; 24/132 R; 24/136 R; 269/903
[58] Field of Search .................... 140/92.1; 29/755; 24/115 G, 132 R, 136 R, 136 K; 269/903

[56] References Cited

U.S. PATENT DOCUMENTS

| | | | |
|---|---|---|---|
| 1,732,627 | 10/1929 | Wilson | 24/132 R |
| 3,839,777 | 10/1974 | Puzio | |
| 3,913,202 | 10/1975 | Pyle et al. | |
| 4,029,277 | 6/1977 | Bulanda | |
| 4,704,775 | 11/1987 | Cross | 29/755 |
| 4,752,991 | 6/1988 | Wegner | 24/132 R |
| 4,878,269 | 11/1989 | Anscher et al. | 24/115 G |

Primary Examiner—Lowell A. Larson
Attorney, Agent, or Firm—Anthony J. Casella; Gerald E. Hespos; Ludomir A. Budzyn

[57] ABSTRACT

To provide a wire end retainer capable of retaining and positioning a collected end portion 11 of a wire bundle during a wire arranging operation. A retainer main body 300 for accommodating the collected end portion 11 and an engaging plate 400 slidably fittable into the retainer main body 300 are provided. The retainer main body 300 is formed with an insertion hole 311, and the engaging plate 400 is formed with a tapered hole 430. The holes 310 and 430 communicate with each other inside the retainer main body 300. By pulling the engaging plate 400 after the collected end portion 11 is inserted through the insertion hole 310, the collected end portion 11 is tightly held between opposite faces 431, 432 of the tapered hole 430.

13 Claims, 14 Drawing Sheets

WIRE RETAINER

BACKGROUND OF THE INVENTION

1. Field of the Invention

The present invention relates to a wire retainer for retaining at least one wire, particularly to a wire end retainer for retaining an end portion of a wire bundle, during a wire arranging operation when a wiring harness is assembled.

2. Description of the Prior Art

To assemble a wiring harness, wires are put on U-shaped wire supports that are disposed on a wire arrangement board in a specified configuration. The properly arranged wires then are bundled to form the wiring harness. The respective wires may not necessarily be arranged one by one. There is often adopted a process of forming specified sub-assemblies in advance and arranging these sub-assemblies on the wire arrangement board.

FIG. 15 shows an end portion of a sub-assembly 1 of a wiring harness. The sub-assembly 1 includes a plurality of ground wires 2. Ends 3 of the respective wires 2 of the sub-assembly 1 are connected by welding or the like during the assembling of the sub-assembly 1 such that they are short-circuited with each other, and an insulation member such as a vinyl cover 4 is fitted on the connected ends 3 using a tape 5. Conventionally, when such a sub-assembly 1 is arranged on the wire arrangement board, the wires 2 are supported by a wire support 6 in a position near the ends 3 as shown in FIG. 15.

However, since the wires 2 are merely received by the support 6 as shown in FIG. 15, they cannot be stably supported. This has caused a problem such that the wires 2 come off during the wire arranging operation.

Further, depending upon the specification of the wiring harness to be assembled, it may be necessary to make an accurate measurement from a leading end 4a of the vinyl cover 4. Such a measurement is necessary, for example, when an accessory such as a clamp is mounted in a position at a specified distance from the leading end 4a. In such a case, the leading end 4a needs to be positioned. However, with the support as shown in FIG. 15, the leading end 4a cannot be accurately positioned.

There may also be considered a method for supporting the wires 2 by inserting the wire support 6 into the bundle of the wires 2 as shown in FIG. 16. Even with this method, the wires 2 are still unstably supported. In addition, since the wire arranging operation is performed while pulling the wires 2 in a direction indicated by an arrow in FIG. 16, the position of the leading end 4a is caused to change by the pulling force. As a result, the leading end 4a cannot accurately be positioned.

In view of the above problems, it is an object of the present invention to provide a wire retainer capable of retaining a wire, particularly an end portion of a wire bundle, while accurately positioning it on a wire arrangement board.

SUMMARY OF THE INVENTION

The invention is directed to a wire end retainer used for a wire arranging operation in a wiring harness assembling process to retain a collected end portion formed by collected ends of a specified number of wires on a wire arrangement board. The retainer may comprise a support for securing the wire end retainer on the wire arrangement board. The retainer may further include a main body mounted on the support. An accommodation space is formed in the retainer main body for permitting the entrance of the collected end portion along a specified insertion direction. A locking member is mounted or provided on the retainer main body and is displaceable between a retaining position for retaining the collected end portion accommodated in the accommodation space and a release position for freeing the collected end portion.

The wire end retainer can be arranged on the wire arrangement board by securing the support to the wire arrangement board. During the wire arranging operation, the collected end portion is inserted into the accommodation space in the specified direction to arrange it in the specified position. By changing the position of the locking member, the collected end portion in the accommodation space can be retained, thereby locating the collected end portion in the specified position and enabling accurate measurement. On the other hand, by changing the position of the locking member to its initial position, the collected end portion is freed, enabling it to be taken out of the accommodation space.

The locking member may comprise an engaging plate slidably fittable in the accommodation space of the retainer body. The engaging plate may be formed with a hole extending therethrough in the insertion direction. The hole may be elongate in the slidable direction of movement of the engaging plate. Additionally, the hole may be tapered such that one longitudinal end is narrow and the other longitudinal end is wide.

Embodiments with the tapered hole operate substantially as described above. In particular, the collected end portion may pass through the wide end of the tapered hole. When the engaging plate is slid from this state, the tapered hole becomes narrower and the edge of the tapered hole pressingly engages the collected end portion. Thus, the collected end portion is retained by the tapered hole, and can be located in the specified position in the accommodation space. This embodiment also has an advantage in that a change in the outer diameter of the collected end portion of the wires can be easily accommodated by the tapered hole.

The engaging plate may be slidably fittable along the vertical direction and the tapered hole may be formed such that its width gradually decreases toward the bottom. This construction has the same action as the preceding embodiment. Particularly, the collected end portion can be retained merely by pulling the engaging plate upward after the insertion of the collected end portion. Further, lightly pressing the upper face of the engaging plate downwardly from this state, overcomes engaging forces on the wires and permits the engaging plate to move downwardly by the action of gravity, thereby allowing the collected end portion to be taken out. Accordingly, the collected end portion can be quite easily retained and taken out, thereby improving a working efficiency.

The peripheral face of the tapered hole may be so slanted along the insertion direction as to make the tapered hole smaller. This construction has the same option as the preceding embodiments. In addition, when the collected end portion is pulled in a direction opposite from the insertion direction after being retained and positioned, the opening edge of the tapered hole tends to cut into the collected end portion. This securely prevents the collected end portion from coming out.

The entrance of the accommodation space into which the collected end portion is inserted may be bevelled. This construction has the same operation as any one of the preceding embodiments. In addition, since the entrance of the accommodation space is bevelled, the collected end portion is easily insertable into the accommodation space. Thus, the wire arranging operation can be more smoothly performed.

According to a further preferred embodiment of the present invention, the locking member may comprise a rotatable member which is rotatably mounted on the retainer main body. This construction has an operation similar to the preceding embodiments. Particularly, the rotatable member may be rotated to a retaining position after insertion of the collected end portion into the accommodation space. In this position, a contact face of the rotatable member contacts the collected end portion and urges it against a wall face defining the accommodation space. On the other hand, the contact face may be separated from the collected end portion by rotating the rotatable member toward the retracted position. This frees the collected end portion, enabling it to be taken out of the accommodation space. Accordingly, the collected end portion can be easily retained and freed only by the rotational movement of the rotatable member, and the wire end retainer can be manufactured at a reduced cost.

The rotatable member may comprise a contact portion with which the wire to be accommodated in the accommodation space comes into contact for automatically rotating the rotatable member to the retaining position. Since the rotatable member is automatically rotated to its retaining position by the collected end portion being inserted into the accommodation space, the collected end portion can be very easily positioned. As a result, the wire arranging operation can be more smoothly performed.

The rotatable member may comprise an axis of rotation displaced from its center of gravity, and may be constantly biased toward the retracted position by the action of gravity. This construction has the same action as any of the constructions according to the preceding embodiments. In addition, since the rotatable member is constantly biased toward the retracted position, it automatically rotates by only pulling the collected end portion in such a direction to take it out of the accommodation space. Therefore, the collected end portion can be easily taken out of the accommodation space.

There may further be provided an insertion restricting member for coming into contact with the collected end portion accommodated in the accommodation space to restrict the insertion of the collected end portion into the accommodation space. This construction has the same action as any of the constructions according to the preceding embodiments. In addition, while being inserted into the accommodation space, the collected end portion comes into contact with the insertion restricting member, with the result that the insertion of the collected end portion into the accommodation space is restricted. In other words, the collected end portion can be arranged in the specified position within the accommodation space only by inserting it into the accommodation space until it comes into contact with the insertion restricting member. Accordingly, the collected end portion can be easily positioned, retained and detached, further improving the efficiency of the wire arranging operation.

These and other objects, features and advantages of the present invention will become more apparent upon a reading of the following detailed description and accompanying drawings.

DETAILED DESCRIPTION OF THE PREFERRED EMBODIMENTS

Figure 1:
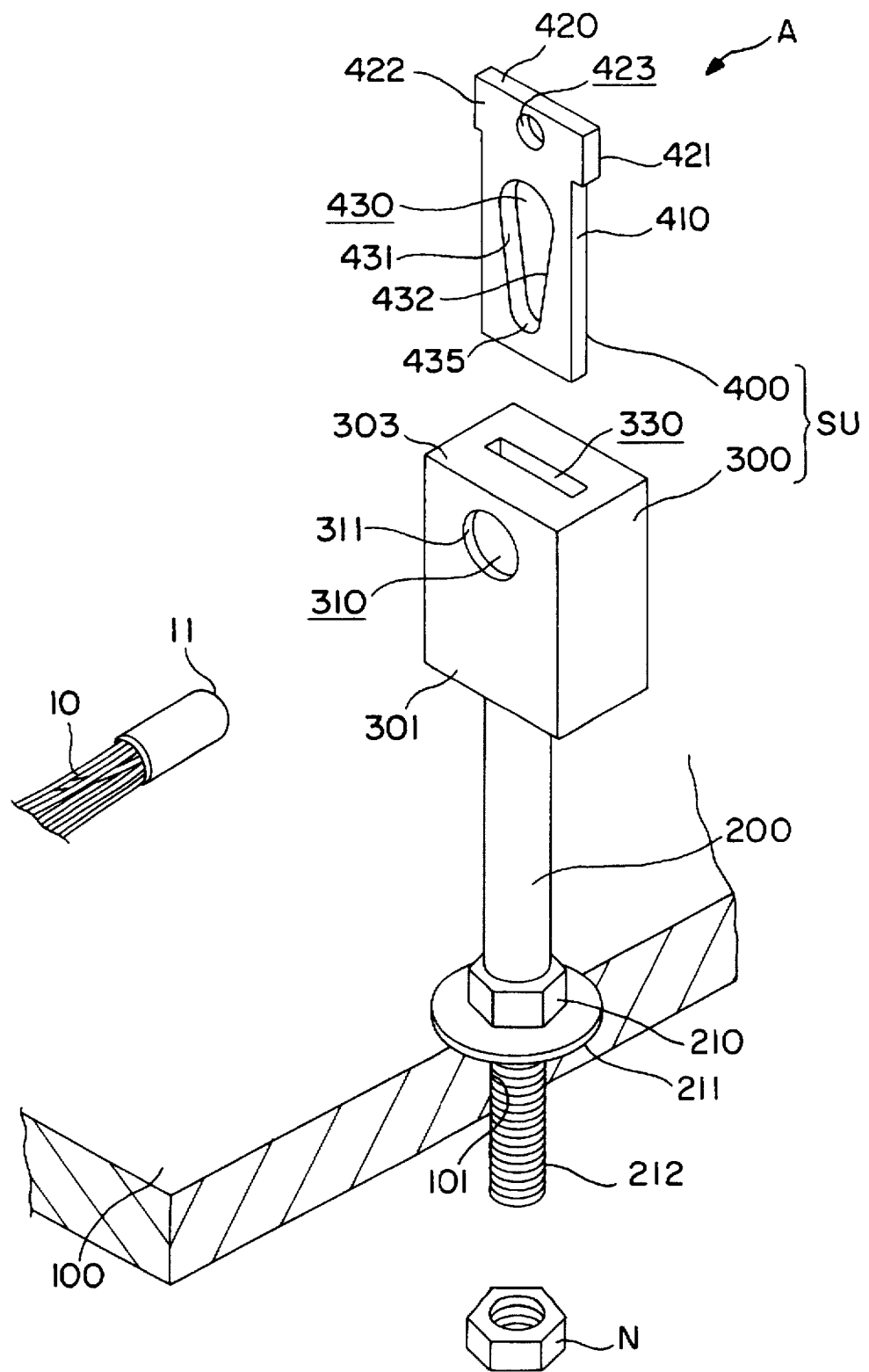
FIG. 1 is an exploded perspective view of a retainer according to a first embodiment of the invention when it is arranged on a wire arrangement board.

FIG. 1 is a perspective view showing an operation of retaining a collected end portion 11 of wires 10 to be arranged using a wire end retainer or a wire retainer or a wire holding device or a wire holding jig A (hereafter, merely "retainer") according to a first embodiment of the invention.

With reference to FIG. 1, the retainer A is used during a wire arranging operation in a wiring harness assembling process to secure the collected end portion 11, formed by collectively connecting ends of a plurality of wires 10, in a specified position on a wire arrangement board 100 as a work table for the wire arranging operation. In this embodiment, the respective wires 10 are ground wires of the wiring harness, and ends thereof are connected by welding. A cover member e.g. of vinyl is fitted on the connected ends, thereby forming the collected end portion 11.

The retainer A includes a support 200 and a retaining portion SU connected with the upper end of the support 200.

The support 200 can be formed of, e.g. a round bar member. A nut 210 formed with a fixing washer 211 is mounted at the bottom of the support 200. An external thread 212 is formed on the support 200 between the nut 210 and the bottom of the support 200. The portion of the support 200 where the external thread 212 is formed is inserted into a mount hole 101 formed in the wire arrangement board 100. The retainer A is secured to the wire arrangement board 100 by fastening a nut N to the externally threaded portion of the support 200 from underneath the wire arrangement board 100.

The retaining portion SU is adapted to securely position the collected end portion 11 of the arranged wires 10, and includes a retainer main body 300 and an engaging plate 400. Although the retainer main body 300 and the engaging plate 400 are separated in FIG. 1, the engaging plate 400 is actually used while being inserted into an engaging slot 330 of the retainer main body 300 (see FIG. 3).

Figure 2:
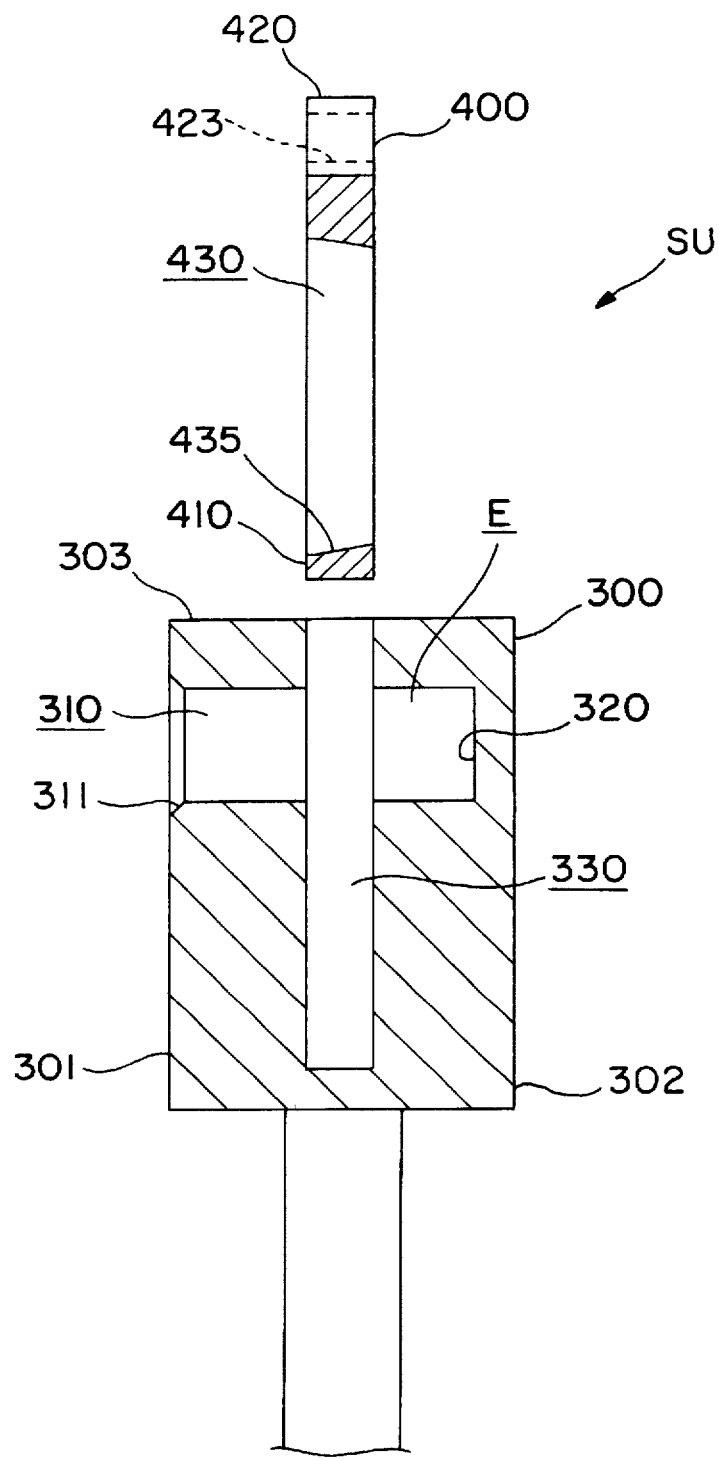
FIG. 2 is a section of the retainer showing the interior construction of a retainer main body and that of an engaging plate.

The retainer main body 300 is in the form of a substantially rectangular block, and is secured to the upper end of the support 200. FIG. 2 shows sections of the retainer main body 300 and the engaging plate 400 in their separated state.

With reference to FIGS. 1 and 2, the retainer main body 300 is formed with an insertion hole or recess 310 which is open in a front face 301 of the retainer main body 300 and extends from the front face 301 toward a rear face 302 by a specified distance. In other words, the insertion hole 310 is preferably not a through hole, but has an inner back face 320. The opening edge of the insertion hole 310 is bevelled to form a C-face 311.

The collected end portion 11 is inserted into the insertion hole 310, and the space within the insertion hole 310 forms an accommodation space E for the collected end portion 11. Further, the leading end of the collected end portion 11 comes to contact with the inner back face 320 of the insertion hole 310, with the result that any further insertion of the collected end portion 11 into the hole 310 is restricted.

The retainer main body 300 is also formed with the engaging slot 330 which is open in an upper face 303 of the retainer main body 300 and extends downward from the upper face 303 by a specified distance. A sliding portion 410 of the engaging plate 400 is fittable or slidable into or arrangeable in the engaging slot 330. The engaging slot 330 is in communication with an intermediate portion of the accommodation space E. In other words, as shown in FIG. 2, the engaging slot 330 intersects with the accommodation space E at an angle, in particular along substantially horizontal and substantially vertical directions.

The engaging plate 400 is formed of a substantially T-shaped substantially flat plate, and includes a grip 420 and the sliding portion 410 extending downward from the grip 420.

The sliding portion 410 is slidably fittable into the engaging slot 330 along the vertical direction. With reference to FIG. 1, the sliding portion 410 is formed with a tapered hole 430 extending in the longitudinal direction (vertical direction in FIG. 1). The tapered hole 430 is such a through hole that its width substantially decreases toward the bottom (FIG. 1) and/or toward the inner back face 320, when inserted into the retainer main body 300 (FIG. 2). Accordingly, when the sliding portion 410 is accommodated in the engaging slot 330, the insertion hole 310 is in communication with the tapered hole 430.

A pair of opposite faces 431, 432 are formed by laterally opposing portions of an inner face 435 of the tapered hole 430 (FIG. 1). The distance between the opposite faces 431 and 432 varies along the vertical direction. In other words, the spacing between the opposite faces 431 and 432 decreases toward the bottom of the tapered hole 430 or in an insertion direction of the engaging plate 400 into the insertion hole 310 of the retainer main body 300. The width of the tapered hole 430 at its upper end is set substantially equal to the inner diameter of the insertion hole 310.

The inner face 435 of the tapered hole 430 is slanted along the thickness direction of the sliding portion 410 (see FIG. 2). Specifically, when the sliding portion 410 is accommodated in the engaging slot 330, the inner face 435 of the tapered hole 430 is slanted from the front face 301 of the retainer main body 300 toward the rear face 302 thereof so as to make the tapered hole 430 smaller. The actions and effects brought about this slanted inner face 435 are described later.

The grip 420 is gripped by hand to insert and detach the engaging plate 400 into and from the engaging slot 330. The grip 420 is formed with a through hole 423 extending in the thickness direction. The through hole 423 prevents a slip when the grip 420 is gripped. On the opposite sides of the grip 420, there are formed projected portions 421 and 422 bulging to the left and right. The projected portions 421, 422 come into contact with the upper face 303 of the retainer main body 300 when the engaging plate 400 is inserted into the engaging slot 330. This prevents the engaging plate 400 from being completely fitted into the engaging slot 330. The projected portions 421, 422 may also be dispensed with. In this case, the depth of the engaging slot 330 may be adjusted to prevent the engaging plate 400 from being completely fitted into the engaging slot 330. Alternatively, this may be prevented by lengthening the sliding portion 410, or providing stopping means or projections (not shown) on the retainer main body 300, particularly on the periphery or at the inserting hole 310 or engaging slot 330.

Next, the actions and effects of this embodiment are described.

Figure 3:
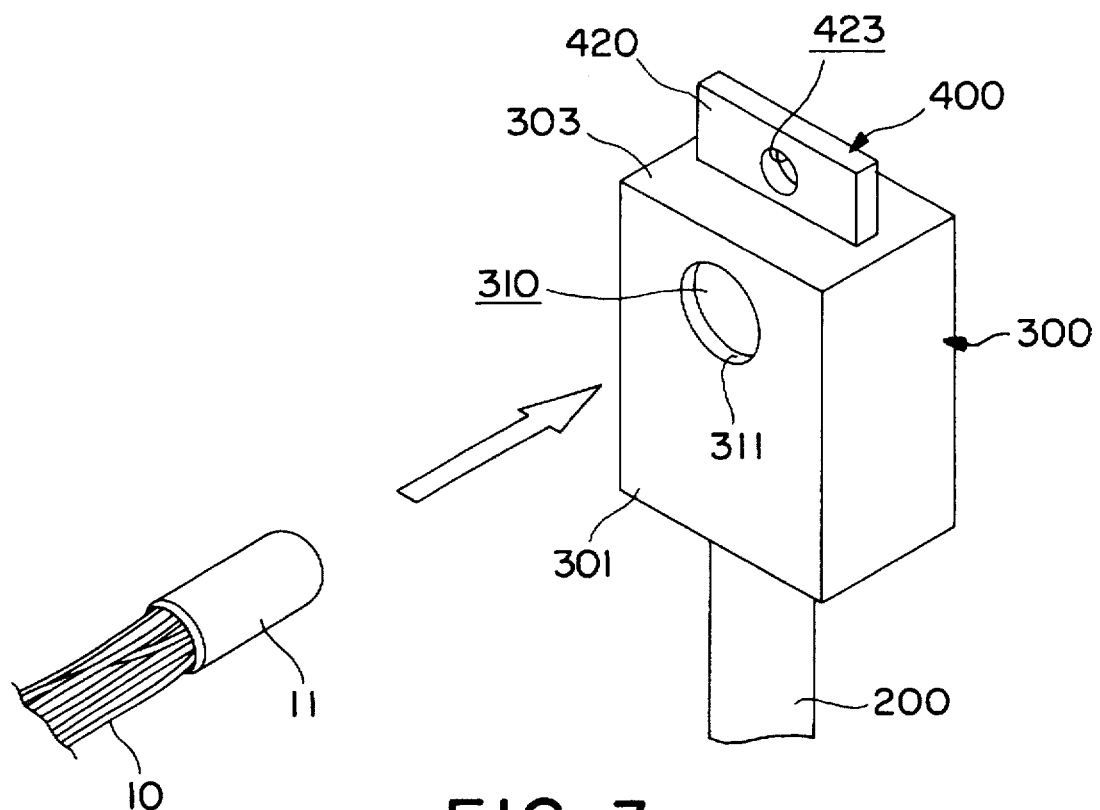
FIG. 3 is a perspective view of an essential portion of the retainer before a collected end portion is inserted into the retainer main body.
Figure 4:
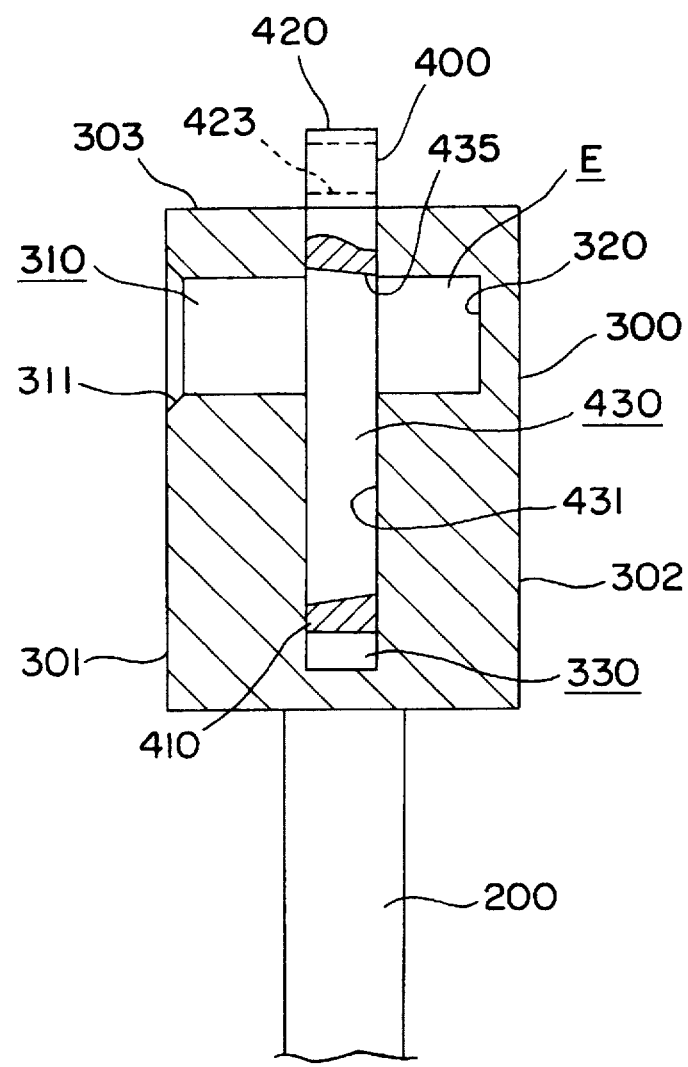
FIG. 4 is a section showing a positional relationship between the retainer main body and the engaging plate before the collected end portion is inserted into the retainer main body.

First, by securing the support 200 to the wire arrangement board 100, the retainer A is arranged in the specified position on the wire arrangement board 100 (see FIG. 1). At this time, the engaging plate 400 is already fitted into the retainer main body 300 (see FIG. 3). In the state of FIG. 3, the retainer main body 300 and the engaging plate 400 are positioned with respect to each other as shown in FIG. 4, i.e. the engaging plate 400 is inserted into the engaging slot 330 such that a wider portion of the tapered hole 430 is aligned with the insertion hole 310, and the insertion hole 310 formed in the retainer main body 300 communicates with the tapered hole 430 formed in the engaging plate 400.

Figure 5:
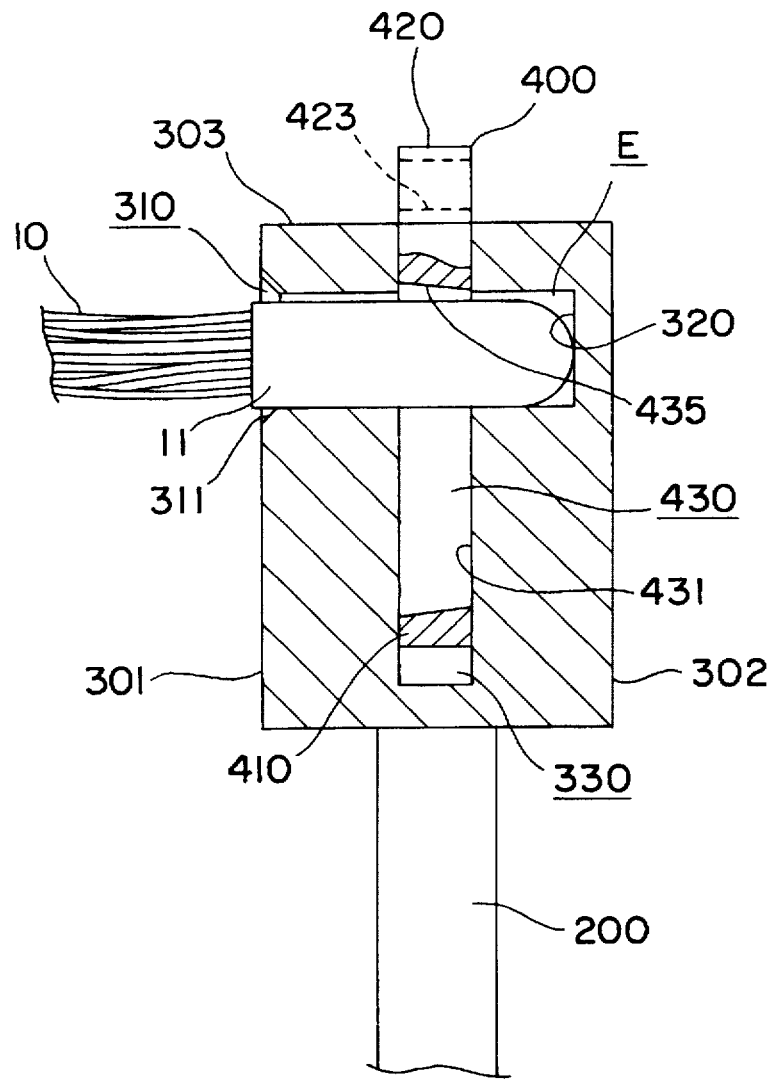
FIG. 5 is a section showing a positional relationship between the retainer main body and the engaging plate after the collected end portion is inserted into the retainer main body.

During the wire arranging operation, the collected end portion 11 of the wires 10 is inserted into the insertion hole 310 along an arrow in the state of FIG. 3, with the result that the collected end portion 11 is substantially housed in the accommodation space E. At this time, the insertion of the collected end portion 11 into the space E is restricted by the inner back face 320 of the insertion hole 310 as shown in FIG. 5. More specifically, as the collected end portion 11 further enters the space E, the leading end of the collected end portion 11 comes into contact with the inner back face 320, thereby preventing any further insertion of the collected end portion 11 into the insertion hole 310. As a result, the collected end portion 11 can be arranged in the specified position within the space E.

Figure 6:
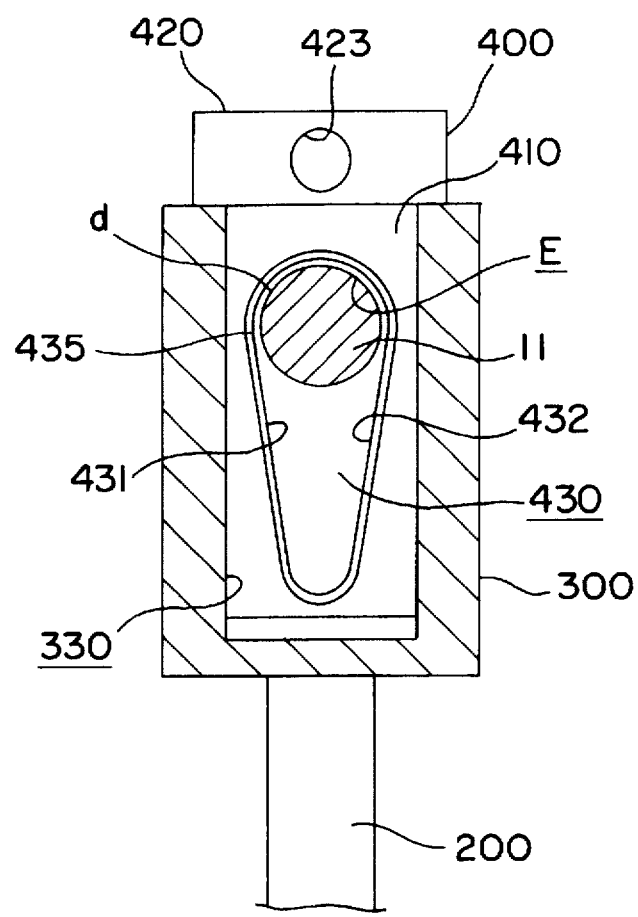
FIG. 6 is a partial front view in section of the retainer showing a positional relationship between the retainer main body and the engaging plate when the collected end portion is inserted into the retainer main body.

FIG. 6 is a section along the widthwise direction showing a positional relationship of the collected end portion 11 and the tapered hole 430 in the state of FIG. 5. As shown in FIG. 6, when set in the accommodation space E, the collected end portion 11 is inserted through the upper part, i.e. the large width part of the tapered hole 430. Accordingly, a clearance d is formed between the collected end portion 11 and the tapered hole 430, i.e. the collected end portion 11 and the tapered hole 430 are loosely engaged.

Figure 7:
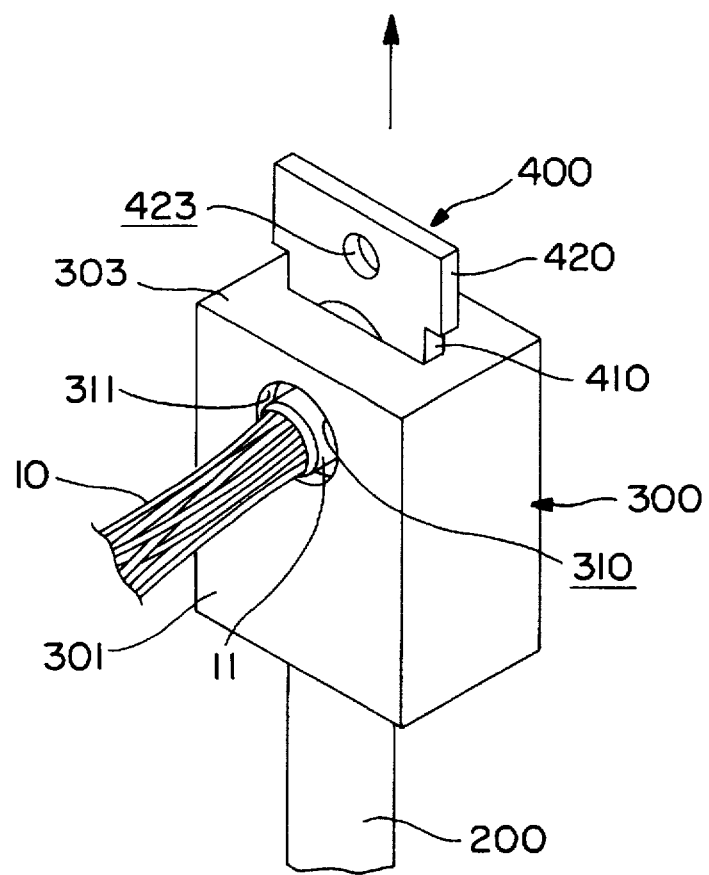
FIG. 7 is a perspective view of an essential portion showing the collected end portion retained by the retainer main body.
Figure 8:
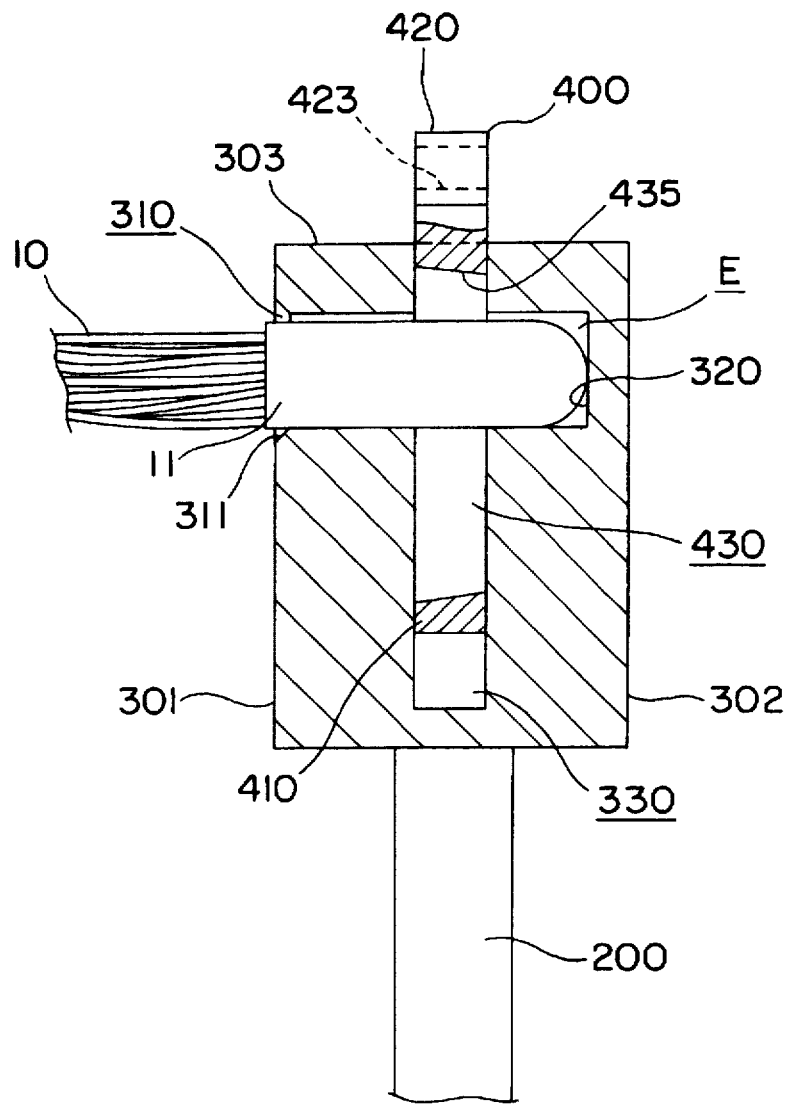
FIG. 8 is a section of the retainer showing the retainer main body and the engaging plate when the collected end portion is retained by the retainer main body.
Figure 9:
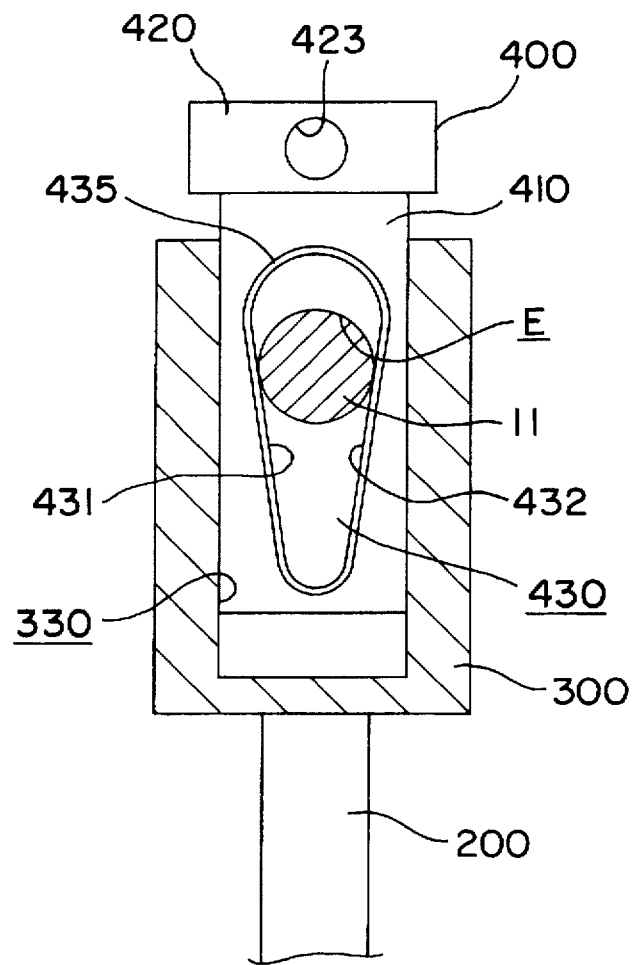
FIG. 9 is a partial front view in section of the retainer showing a positional relationship between the retainer main body and the engaging plate when the collected end portion is retained by the retainer main body.

Subsequently, as shown in FIG. 7, the grip 420 of the engaging plate 400 is gripped by hand or by any other e.g. mechanical means, to pull the engaging plate 400 upward. At this stage, a positional relationship between the retainer main body 300 and the engaging plate 400 is as shown in FIG. 8, and the one between the collected end portion 11 and the tapered hole 430 is as shown in FIG. 9. More specifically, by sliding the engaging plate 400 upward, the tapered hole 430 is displaced with respect to the collected end portion 11. When this displacement is viewed from the collected end portion side, the pair of opposite faces 431, 432 of the tapered hole 430 come closer to the collected end portion 11 until they hold or center or place the collected end portion 11 therebetween. Thus, the collected end portion 11 is tightly held by the opposite faces 431, 432.

By tightly holding the collected end portion 11 arranged in the specified position within the accommodation space E by the opposite faces 431, 432, the collected end portion 11 can be retained and positioned. Accordingly, the collected end portion 11 can be located in the specified position on the wire arrangement board 100 during the wire arranging operation. As a result, the collected end portion 11 can be stably supported during the wire arranging operation, enabling an accurate measurement from the leading end of the collected end portion 11.

On the other hand, by sliding the engaging plate 400 downward, the opposite faces 431, 432 part from the collected end portion 11 (see FIG. 6), with the result that the collected end portion 11 is easily withdrawable from the accommodation space E.

In addition to the above actions and effects, this embodiment has the following actions and effects.

First, since the opposite faces 431, 432 are formed by the parts of the inner face 435 of the tapered hole 430, the construction for holding the collected end portion 11 can be simplified. Thus, the cost of the mechanism for holding the collected end portion 11 can be reduced, which contributes to a more inexpensive retainer A.

Since the collected end portion 11 can be held only by sliding the engaging plate 400, it can be positioned by a simple operation and the wire arranging operation can be smoothly performed.

Further, since the engaging plate 400 is slidable along the vertical direction in this embodiment, it falls by the action of gravity only by slightly tapping the top of the engaging plate 400 when the retained collected end portion 11 is to be detached. In other words, the opposite faces 431, 432 part from the collected end portion 11, thereby freeing the collected end portion 11 and enabling an easy withdrawal thereof from the accommodation space E. Thus, the wire arranging operation can be more smoothly performed.

Since the collected end portion 11 is held by the opposite faces 431, 432 of the tapered hole 430, a change in the outer diameter of the collected end portion 11 can be advantageously easily coped with. In other words, the collected end portion 11 can be held between the opposite faces 431, 432 by slightly lifting the engaging plate 400 if its outer diameter is larger, or by considerably lifting the engaging plate 400 if its outer diameter is small. The width of the tapered hole 430 is not limited to the one as shown in this embodiment, but it may be so changed as to conform to the outer diameter of the collected end portion 11 by changing the design of the tapered hole 430.

Since the opposite faces 431, 432 are slanted in a direction from the front face 301 of the retainer main body 300 to the rear face 302 thereof, i.e. in the insertion direction of the collected end portion 11, the collected end portion 11 is not easily withdrawable once it passes through the tapered hole 430 and is tightly held between the opposite faces 431, 432. This is because the slant causes the opposite faces 431, 432 to cut into the collected end portion 11 even if an attempt is made to withdraw the held collected end portion 11. Accordingly, the collected end portion 11 can be securely positioned and, hence, the wire arranging operation can be more smoothly performed. There is an additional advantage that the bevelled opening edge of the insertion hole 310 facilitates the insertion of the collected end portion 11.

Figure 10:
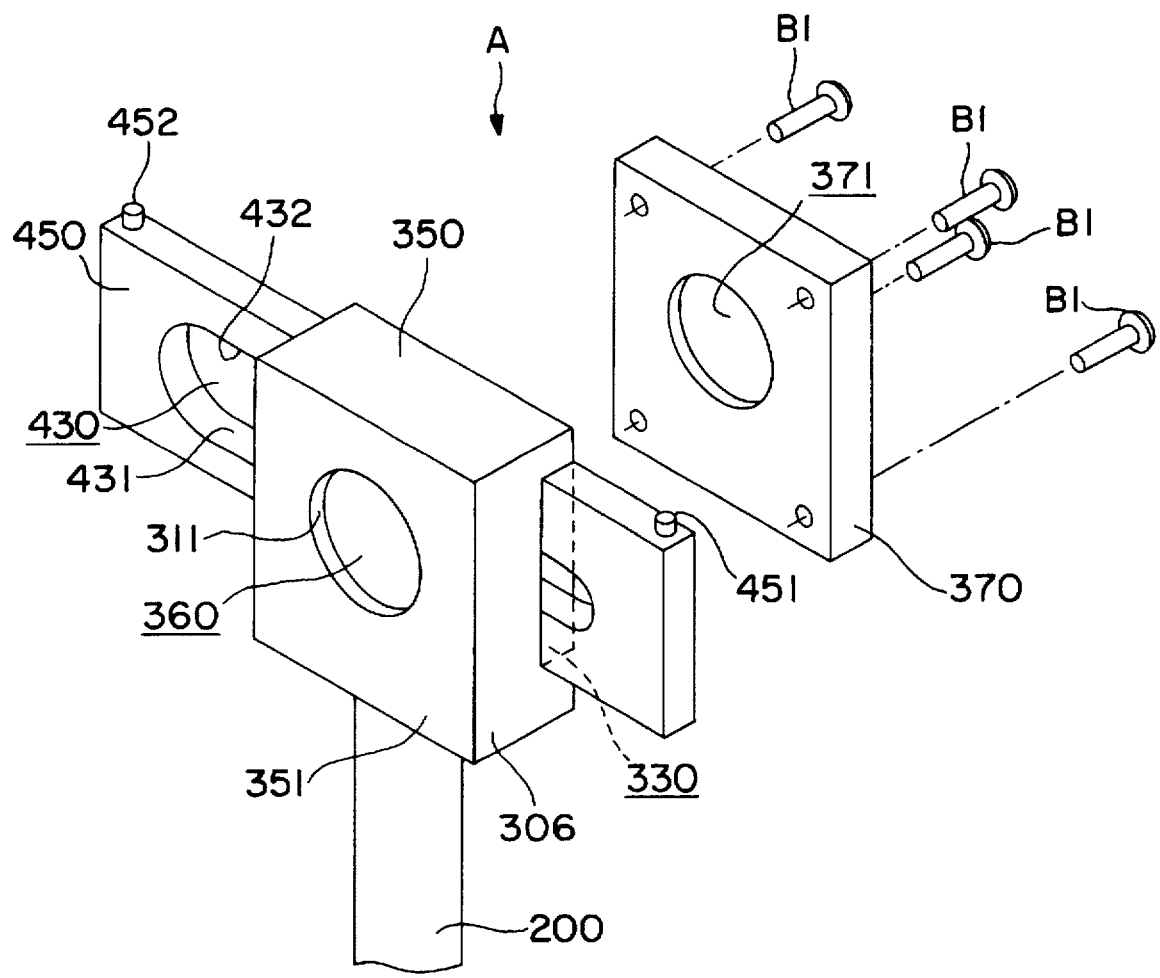
FIG. 10 is an exploded perspective view showing an essential portion of a retainer according to one modification of the first embodiment.

FIG. 10 is an exploded perspective view of an essential portion of a retainer A according to one modification. This modification differs from the first embodiment in the following points.

As opposed to the vertically slidable engaging plate 400 of the first embodiment, an engaging plate 450 of this modification is slidable along a widthwise direction.

In order to prevent the engaging plate 400 from being completely fitted into the engaging slot 330, the projected portions 421, 422 (see FIG. 1) are formed at the engaging plate 400 of the first embodiment. In this modification, spring pins 451, 452 are provided instead of the projected portions 421, 422.

In the first embodiment, the insertion hole 310 is a bottomed hole, and the insertion of the collected end portion 11 is restricted by its inner back face 320. In this modification, a retainer main body 350 is formed with an insertion hole 360 which is through in the insertion direction, and the insertion of the collected end portion 11 is restricted by a contact member 370. Since the other construction is same as that of the first embodiment, no description is given thereon.

The retainer main body 350 is formed with the insertion hole 360. The insertion hole 360 is a through hole which extends from a front face 351 of the retainer main body 350 to its rear face. The retainer main body 350 is also formed with an engaging slot 330 which communicates opposite side faces. Similar to the first embodiment, the insertion hole 360 and the engaging slot 330 communicate with each other.

The engaging plate 400 is slidable along the widthwise direction, and the spring pins 451, 452 prevent it from coming out of the retainer main body 350. Since the engaging plate 400 is slid along the widthwise direction in this modification, the grip 420 (see FIG. 1) is not provided.

The contact member 370 is fastened to the rear face of the retainer main body 350 by screws B1. A round recess 371 is formed in the front face of the contact member 370. The collected end portion 11 is inserted into the insertion hole 360 until it comes into contact with the bottom face of the recess 371.

The recess 371 may be dispensed with. Further, by connecting the spring pin 451 and the retainer main body 350 by, e.g. a tension spring, the engaging plate 400 can be constantly biased in such a direction to hold the collected end portion 11. The modification thus constructed has the same actions and effects as the first embodiment.

The contact member 370 may also be dispensed with. In such a case, the collected end portion 11 can be located in the specified position by, for example, bringing the leading end of the inserted collected end portion 11 into contact with a finger of an operator or with other means put on the rear face of the retainer main body 350 when the collected end portion 11 is inserted into the insertion hole 360.

Figure 11A:
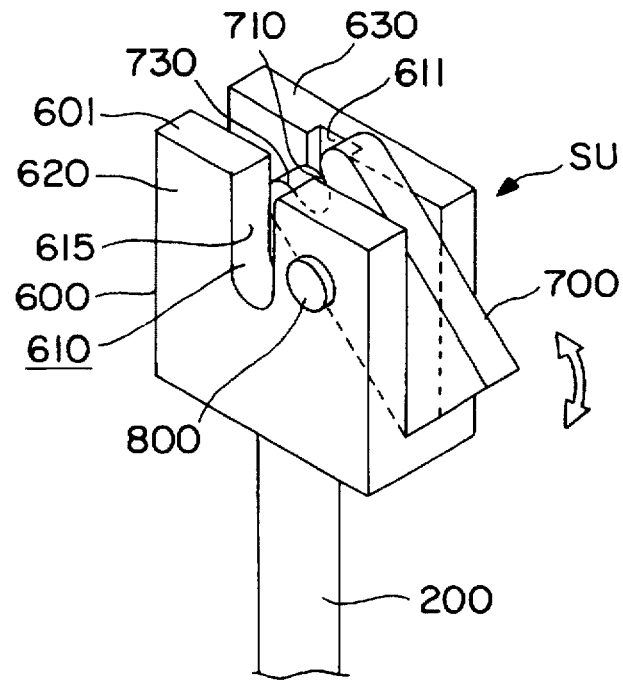
FIG. 11(A) is an exploded perspective view of a retainer according to a second embodiment of the invention.

Next, a second embodiment of the invention is described. FIG. 11(A) is a perspective view of an essential portion of a retaining portion SU of a retainer A according to a second embodiment.

With reference to FIG. 11(A), the features of this embodiment are as follows.

The collected end portion 11 is fittable into a retainer main body 600 from above, and the main body 600 is formed with a slot 610 into which the collected end portion 11 is fitted or fittable.

A rotatable member 700 is rotatably or pivotably connected with the retainer main body 600 to hold the collected end portion 11 accommodated in the slot 610. Since the other construction is same as that of the first embodiment, no description is given thereon.

Similar to the first embodiment, the retaining portion SU is secured to the upper end of the support 200. The retainer main body 600 is in the form of a substantially U-shaped block, and has a pair of wall portions 620, 630 substantially facing along forward and backward directions. The retainer main body 600 is formed with a substantially vertically extending slot which acts as the slot 610.

The slot 610 extends downward from an upper face 601 of the retainer main body 600. More specifically, the slot 610 is formed such that it extends through the wall portion 620 and depresses the wall portion 630 by a specified distance along the forward and backward directions. In other words, an end face 611 of the slot 610 is formed at a portion of the wall portion 630.

The rotatable member 700 is a plate-like member, and is disposed between the wall portions 620, 630. A curved face 710 is formed at the leading end face of the rotatable member 700. A substantially middle portion of this leading end face is depressed so that the opposite side portions of the leading end of the rotatable member 700 project. Further, the rotatable member 700 is so mounted on the retainer main body 600 via a pin 800 as to be rotatable along directions indicated by arrows in FIG. 11(A). Accordingly, as the rotatable member 700 rotates, the curved face 710 moves closer to and away from an inner wall face 615 of the slot 610.

The rotatable member 700 is supported by the pin 800 in a position displaced from its center of gravity and, therefore, is constantly in a position as shown in FIG. 11(A). More specifically, the rotatable member 700 is constantly biased by the action of gravity in such a direction that the curved face 710 substantially retracts from the slot 610 (in such a direction that the curved face 710 parts from the slot 610) while a part of its leading end is located in the slot 610 (see FIG. 12). Alternatively or additionally a biasing means e.g. a spring or the like may be provided to bias the curved face 710 substantially away from the slot 610.

Figure 12:
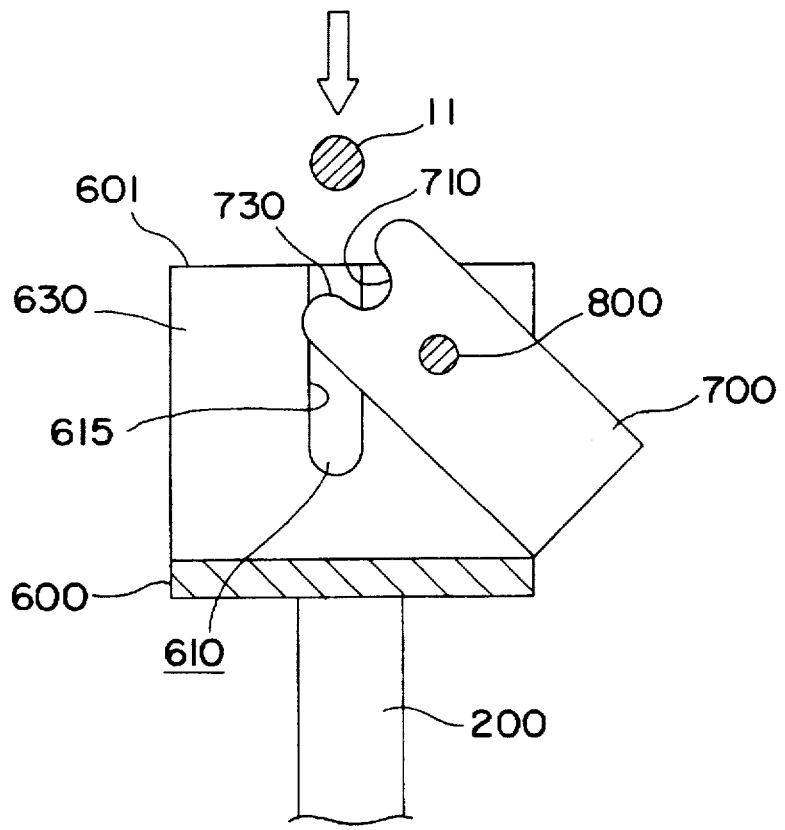
FIG. 12 is a partial front view in section of the retainer of FIG. 11(A) showing a positional relationship between the retainer main body and the engaging plate before the collected end portion is retained by the retainer main body.
Figure 13:
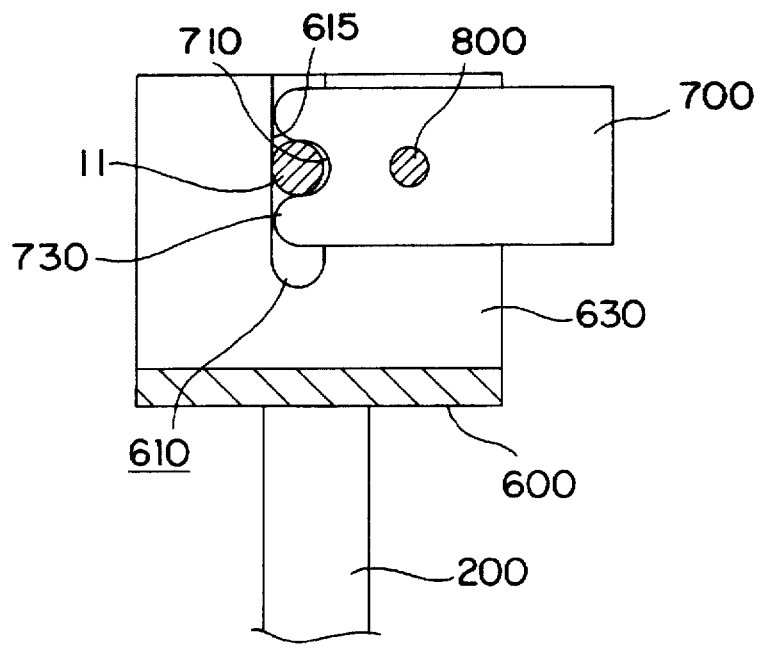
FIG. 13 is a partial front view in section of the retainer of FIG. 11(A) showing a positional relationship between the retainer main body and the engaging plate when the collected end portion is retained by the retainer main body.

Next, with reference to FIGS. 12 and 13, the actions and effects of this embodiment are described. FIGS. 12 and 13 are sections showing a positional relationship between the retainer main body 600 and the rotatable member 700 before and after the collected end portion is retained, respectively.

First, similar to the first embodiment, the retainer is arranged in a specified position on the wire arrangement board by securing the support 200 to the wire arrangement board. At this time, the rotatable member 700 is in a position retracted or at least partly at a distance or spaced from the slot 610 (retracted position) as shown in FIG. 12.

With reference to FIG. 13, the wires or the collected end portion 11 is inserted into the slot 610 from above (arrow in FIG. 12) the retainer main body 600. At this time, the collected end portion 11 is accommodated in the slot 611 such that the leading end thereof is in contact with the end face 611 of the wall portion 630. In this case, the slot 610 forms the accommodation space for the collected end portion 11, and the end face 611 restricts the insertion of the collected end portion 11 into the accommodation space (slot 610). Accordingly, as the collected end portion 11 enters the accommodation space, the leading end thereof comes into contact with the end face 611, with the result that the collected end portion 11 can be arranged in the specified position within the accommodation space.

While being inserted into the slot 610, the collected end portion 11 comes into contact with a portion 730 at the leading end of the rotatable member 700. Accordingly, as shown in FIG. 13, the rotatable member 700 rotates counterclockwise by being pressed by the collected end portion 11, and the curved face 710 thereof comes closer to the inner wall face 615 of the slot 610. In other words, while being inserted into the slot 610, the collected end portion 11 is automatically held between the curved face 710 of the rotatable member 700 and the inner wall face 615 of the slot 610.

Thus, by holding the collected end portion 11 arranged in the specified position in the slot 610 between the curved face 710 of the rotatable member 700 and the inner wall face 615 of the slot 610, the collected end portion 11 can be retained and positioned. Accordingly, the collected end portion can be located in the specified position on the wire arrangement board during the wire arranging operation. As a result, during the wire arranging operation, the collected end portion 11 can be stably held, enabling e.g. an accurate measurement from the leading end thereof.

On the other hand, when the collected end portion 11 is pulled upward, the rotatable member 700 rotates clockwise by being pressed by the collected end portion 11. This causes the curved face 710 to part from the inner wall face 615, enabling an easy withdrawal of the collected end portion 11 from the slot 610. Particularly in this embodiment, since the rotatable member 700 is biased in such a direction that the curved face 710 parts from the inner wall face 615, the rotatable member 700 is automatically caused to rotate only by lightly pulling the collected end portion 11 upward, enabling an easy withdrawal of the collected end portion 11 from the slot 610. As described above, according to this embodiment, since the collected end portion 11 can be very easily set and withdrawn, the wire arranging operation can be more smoothly performed.

Figure 11B:
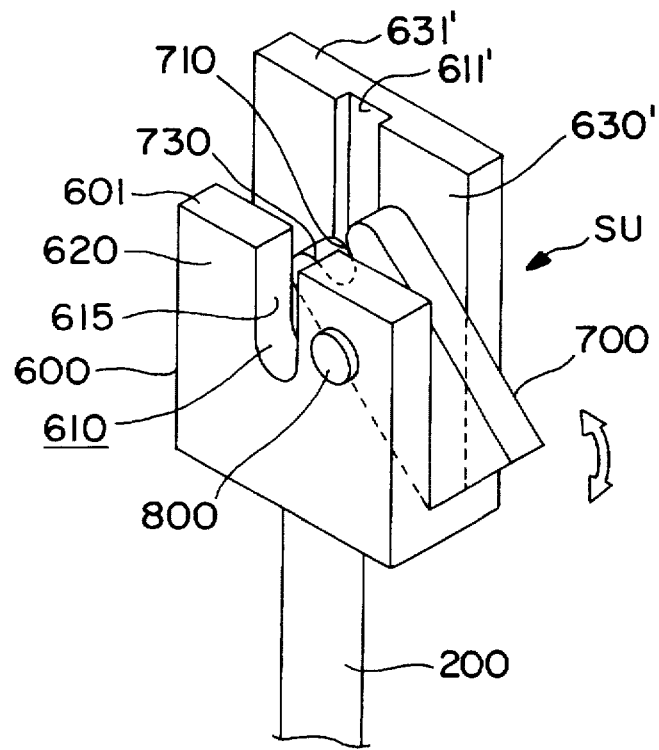
FIG. 11(B) is an exploded perspective view of a retainer according to a modification of the second embodiment of the invention.

Next, a modification of the second embodiment of the invention is described. FIG. 11(B) is a perspective view of an essential portion of a retaining portion SU of a retainer according to a modification of the second embodiment.

The retainer main body 600 of this modification is similarly to the embodiment shown in FIG. 11(A) in the form of a substantially U-shaped block, and has a pair of wall portions 620, 630' substantially facing along forward and backward directions, wherein the wall portion 630' has a longer extension than the wall portion 620 in a direction along the direction of extension of the slot 610 formed in the wall portion 620 (the vertical direction in FIG. 11(B)) or in a direction substantially away from the support 200. A recess 611' is formed on a portion of the wall portion 630', the recess 611' preferably extending up to the leading end 631' of the wall portion 630' and acting as an end face for the slot 610 for a portion of the wall portion 630' overlapping with or facing the other wall portion 620.

The wires may be inserted into the slot 610 formed in the wall portion 620 of the retainer main body 600 by first abutting on or reaching the wall portion 630' in a region, where the wall portion 630' is not facing the wall portion 620 and then shifting or moving the wires toward the other wall portion 620 (e.g. downward in FIG. 11(B)) and inserting them into the slot 610, thereby interacting with the rotatable member 700 in a way similar to the embodiment depicted in FIG. 11(A). The portion of the recess 611' not facing the slot 610 can act as a guiding means for guiding the wires or the collected end 11 thereof to the slot 610 thereby facilitating the insertion procedure or step. By abutting the wires or the collected end 11 thereof on the wall portion 630' before inserting them into the slot 610 the wires or the collected end 11 thereof can be more reliably positioned on the retainer main body 600.

Accordingly it is possible to align in a more efficient, precise and easy way a leading end of the wires or a collected end portion 11 thereof on the retainer main body 600.

The following can be considered to be a further modification of the second embodiment.

First, the shape of the curved face 710 of the rotatable member 700 can be changed in conformity with the outer diameter and/or shape of the collected end portion 11. This enables the retainer A to retain collected end portions 11 having different outer diameters and/or peripheral shapes.

Figure 14A:
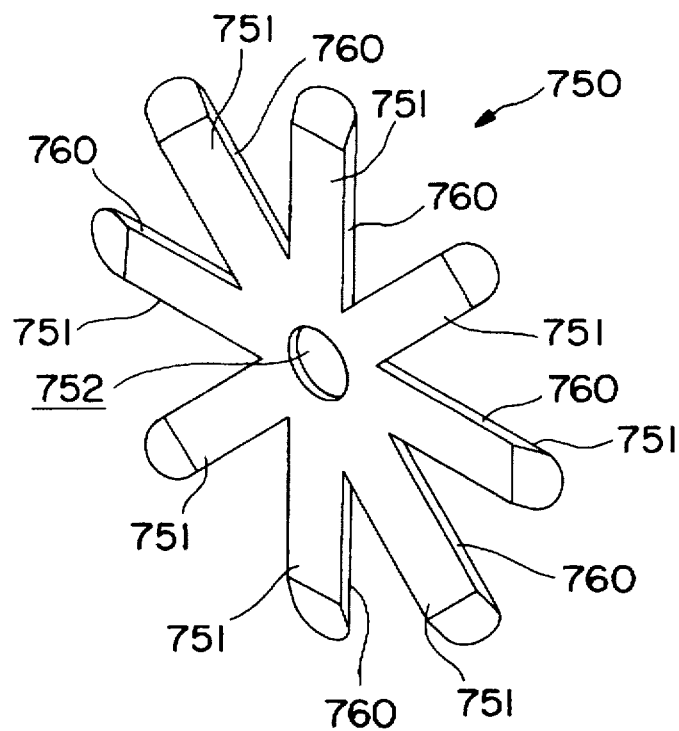
FIG. 14(A) is a perspective view of a rotatable member according to one further modification of the second embodiment.
Figure 14B:
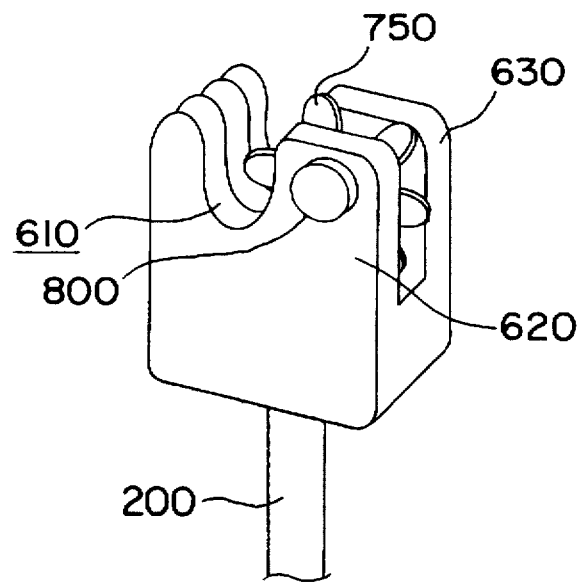
FIG. 14(B) is a perspective view of a retainer according to one further modification of the second embodiment, wherein the retainer comprises rotatable member of FIG. 14(A).
Figure 15:
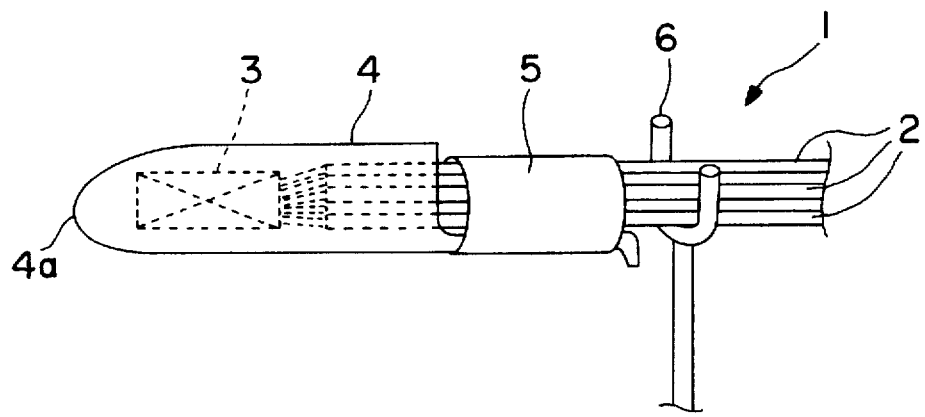
FIG. 15 is a perspective view of an end portion (collected end portion) of a sub-assembly of a wiring harness supported by a prior art wire support.
Figure 16:
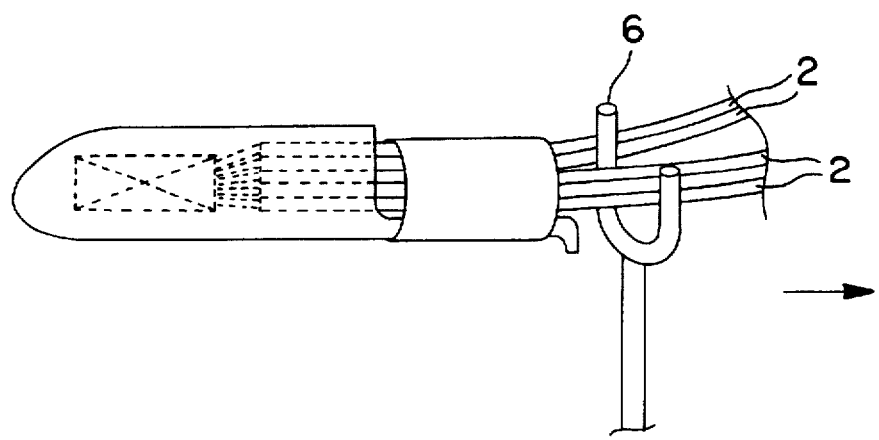
FIG. 16 is a perspective view showing the collected end portion supported by the prior art wire support in another support method.

The rotatable member 700 may be shaped as shown in FIG. 14(A). FIG. 14(A) is a perspective view of a rotatable member 750 according to one modification and FIG. 14(B) is a perspective view of a retainer comprising the rotatable member 750 of FIG. 14(A). The rotatable member 750 has preferably eight radially extending blades 751. The collected end portion 11 is held between two adjacent blades 751. In this case, side faces 760 of the respective blades 751 act as faces for pressing the collected end portion 11. Identified by 752 is an hole into which the pin 800 is inserted or insertable.

Spacings between pairs of adjacent blades 751 are preferably different. Accordingly, a change in the outer diameter or in the shape of the collected end portion 11 to be retained can be easily coped with by rotating the rotatable member 750 and selecting two adjacent blades 751 having a spacing suitable to the outer diameter of this collected end portion 11. Additionally the blades 751 may have different outer peripheral shapes (not shown) in order to accommodate collected end portions 11 having different outer peripheral shapes, e.g. circular, rectangular, elliptical or the like shapes.

Although the wall portion 630 is formed with the end face 611, the slot 610 may be so formed as to extend through the wall portions 620, 630. In such a case, similar to the modification of the first embodiment, the collected end portion 11 can be located in the specified position by, for example, bringing the leading end of the inserted collected end portion 11 into contact with a finger of an operator put on the wall portion 630 when the collected end portion 11 is inserted into the insertion hole 360. Alternatively, a contact member as shown in FIG. 10 may be provided on the rear face of the wall portion 630.

Further, the portion 730 of the rotatable member 700 may be dispensed with. In such a case, the rotatable member 700 may be rotated after the insertion of the collected end portion 11.

It should be appreciated that the invention is not limited to the foregoing two embodiments, but a variety of design changes can be made within the scope of the invention.

What is claimed is:

1. A wire end retainer for arranging wires (10) of a wiring harness on a wire arrangement board (100), comprising:

a cover member fitted on end portions of the wires (10) to define a collected end portion (11).

a retainer main body (300; 350; 600) having means for mounting on the wire arrangement board (100), the retainer main body (330; 350; 600) being formed with an accommodation space (E; 610) for accommodating the collected end portion (11) of the wires (10), the retainer main body (330; 350; 600) further comprising an insertion restricting member (320; 370; 611; 611') defining a periphery of the accommodation space (E; 610) and being disposed to engage and position the cover member of the collected end portion (11) in the accommodation space (11; 610), and a locking member (SU; 400; 450; 700; 750) movably mounted on the retainer main body (300; 350; 600) for movement between a retaining position for tightly holding the collected end portion (11) positioned in the accommodation space (E; 610) by the insertion restricting member (320; 370; 611; 611') and a release position for freeing the collected end portion (11).

2. A wire retainer according to claim 1, wherein the locking member (SU) comprises an engaging plate (400; 450) slidably moveable into the retainer main body (300; 350) along a sliding direction and intersecting the accommodation space (E), the engaging plate (400, 500) being formed with an elongate hole (430) therethrough that extends along the sliding direction of the engaging plate (400; 450), the elongate hole (430) being tapered and having one narrow end and one wide end.

3. A wire retainer according to claim 2, wherein a peripheral face (435) of the tapered hole (430) is so slanted along the insertion direction of the wires (10) as to make the tapered hole (430) smaller on a side of the engaging plate (400; 450) nearer the insertion restricting member (320; 270; 611; 611').

4. A wire retainer according to claim 1, wherein the entrance of the accommodation space (E; 610) into which the wires (10) are inserted is bevelled.

5. A wire retainer according to claim 1, wherein the locking member (SU) comprises a rotatable member (700; 750) which is rotatably provided on the retainer main body (600), the rotatable member (700; 750) being formed with a contact face (710; 760) for coming into contact with the cover member of the collected end portion (11), the rotatable member (700; 750) being displaceable between a retaining position where the cover member of the collected end portion (11) is tightly held between the contact face (710;

760) and a wall face (610, 615) of the retainer main body (600) and a release position where the cover member of the collected end portion (11) is released from the contact face (710; 760) and the wall face (610, 615).

6. A wire retainer according to claim 5, wherein the contact face (710; 760) and the wall face (610, 615) define an accommodation space (610) for permitting the entrance of the cover member of the collected end portion (11) along a specified insertion direction, and wherein the cover member of the collected end portion (11) is accommodated in the accommodation space (610) and pressed by the contact face (710; 760).

7. A wire retainer according to claim 6, wherein the rotatable member (700; 750) comprises at least one contact portion (730; 751) with which the cover member comes into contact to rotate the rotatable member (700; 750) to the retaining position.

8. A wire retainer according to claim 5, wherein the rotatable member (700; 750) comprises at least one contact portion (730; 751) with which the cover member comes into contact to shift the rotatable member (700; 750).

9. A wire retainer according to claim 1, further comprising biasing means for biasing the locking member (400; 450) toward at least one of the retracted position and the retaining position.

10. A wire retainer according to claim 1, wherein the wires (10) define a longitudinal direction, and wherein the insertion restricting member (320; 370; 611; 611') comprises a back face (320; 371; 611; 611') aligned substantially perpendicularly to the longitudinal direction of the wires (10).

11. A wire retainer according to claim 1, wherein the cover member is formed from vinyl.

12. A wire retainer for arranging wires (10) of a wiring harness on a wire arrangement board (100), comprising:

a retainer main body (600) provided on the wire arrangement board (100), the retainer main body (600) being formed with an accommodation space (610) for accommodating portions of the wires (10) and a wall face (615) adjacent the accommodation space (610), and a rotatable member (750) which is rotatable provided on the retainer main body (600), the rotatable member (750) being formed with a contact face (760) for coming into contact with the wires (10), the rotatable member (750) being displaceable between a retaining position where the wires (10) are retained between the contact face (760) and the wall face (610; 615) of the retainer main body (600) and a release position where the contact face (760) is substantially away from the wall face (610; 615) wherein the rotatable member (750) comprises a plurality of radially extending members (751) for coming into contact with the wires (10), the radially extending members (751) being unequally spaced in a circumferential direction.

13. A wire retainer for arranging wires (10) of a wiring harness on a wire arrangement board (100), comprising:

a retainer main body (600) provided on the wire arrangement board (100), the retainer main body (600) being formed with an accommodation space (610) for accommodating portions of the wires (10) and a wall face (615) adjacent the accommodation space (610), and a rotatable member (700, 750) which is rotatable provided on the retainer main body (600), the rotatable member (700, 750) being formed with a contact face (760) for coming into contact with the wires (10), the rotatable member (700, 750) being displaceable between a retaining position where the wires (10) are retained between the contact face (760) and the wall face (610; 615) of the retainer main body (600) and a release position where the contact face (760) is substantially away from the wall face (610; 615), wherein the rotatable member (700; 750) comprises an axis of rotation (800) disposed so that gravity causes the rotatable member to be biased into a selected one of the retracted position and the retaining position.

\* \* \* \* \*